(12) United States Patent
Happ et al.

(10) Patent No.: US 7,759,770 B2
(45) Date of Patent: Jul. 20, 2010

(54) INTEGRATED CIRCUIT INCLUDING MEMORY ELEMENT WITH HIGH SPEED LOW CURRENT PHASE CHANGE MATERIAL

(75) Inventors: Thomas Happ, Dresden (DE); Jan Boris Philipp, Munich (DE)

(73) Assignee: Qimonda AG, Munich (DE)

( * ) Notice: Subject to any disclaimer, the term of this patent is extended or adjusted under 35 U.S.C. 154(b) by 37 days.

(21) Appl. No.: 12/143,948

(22) Filed: Jun. 23, 2008

(65) Prior Publication Data
US 2009/0045385 A1 Feb. 19, 2009

(51) Int. Cl.
*H01L 29/00* (2006.01)
(52) U.S. Cl. ............ 257/536; 257/537; 257/E27.047
(58) Field of Classification Search ......... 257/536, 257/537, E27.047
See application file for complete search history.

(56) References Cited

U.S. PATENT DOCUMENTS 6,744,088 B1 6/2004 Dennison
2007/0034850 A1 2/2007 Kostylev et al.
2008/0035907 A1 2/2008 Czubatyj et al.
2008/0042119 A1 2/2008 Sandoval et al.
2009/0078924 A1* 3/2009 Liang et al. .................. 257/3
2009/0108248 A1* 4/2009 Klostermann et al. ........ 257/2
2009/0161424 A1* 6/2009 Redon ....................... 365/171
2009/0162998 A1* 6/2009 Lee et al. ................... 438/478
2009/0196094 A1* 8/2009 Breitwisch et al. ......... 365/163

OTHER PUBLICATIONS

"Current Reduction in Ovonic Memory Devices", Wally Czubatyj, et al., E\PCOS 06.
"Structural transformations of Ge2Sb2Te5 films studied by electrical resistance measurements", Friedrich, et al., Journal of Applied Physics, vol. 86, No. 9, May 1, 2000.
"Phase-change materials for rewriteable data storage", Wuttig, et al., Nature Materials, vol. 6, Nov. 2007.

* cited by examiner

*Primary Examiner*—Ngan Ngo
(74) *Attorney, Agent, or Firm*—Dicke, Billig & Czaja, PLLC (57) ABSTRACT

An integrated circuit includes a first electrode, a second electrode, and a memory element coupled to the first electrode and to the second electrode, the memory element includes fast-operation resistance changing material doped with dielectric material.

9 Claims, 7 Drawing Sheets

INTEGRATED CIRCUIT INCLUDING MEMORY ELEMENT WITH HIGH SPEED LOW CURRENT PHASE CHANGE MATERIAL

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g., a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. Temperature changes may be applied to the phase change material by heat pulses. The temperature changes of the phase change material may be achieved by driving current through the phase change material itself or by driving current through a resistive heater adjacent the phase change material. With both of these methods, controllable heating of the phase change material causes controllable phase change within the phase change material. The mixture of phase change material with insulating material reduces the volume of phase change material which needs to be heated. The insulating material in the mixture is not performing a phase change during cell operation.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

A typical "set" pulse for setting a phase change memory cell from the amorphous state to the crystalline state is longer in time with smaller amplitude compared to the "reset" pulse. The phase change material of the memory cell must be heated above its crystallization temperature (but usually below its melting temperature) long enough to achieve the crystalline state. In contrast to this pulse, the "reset" pulse for resetting the phase change memory cell from the crystalline state to the amorphous state typically has a short duration and large amplitude. The phase change material is heating above its melting temperature, and then quickly quenched cooling the material. For future technology nodes it is desired to develop phase change materials with reduced "reset" currents and reduced "set" times for low power consumption and fast operation of phase change memory cells in applications like DRAM, mobile DRAM, etc.

SUMMARY

One embodiment provides an integrated circuit. The integrated circuit includes a first electrode, a second electrode, and a memory element coupled to the first electrode and to the second electrode, the memory element includes fast-operation resistance changing material doped with dielectric material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
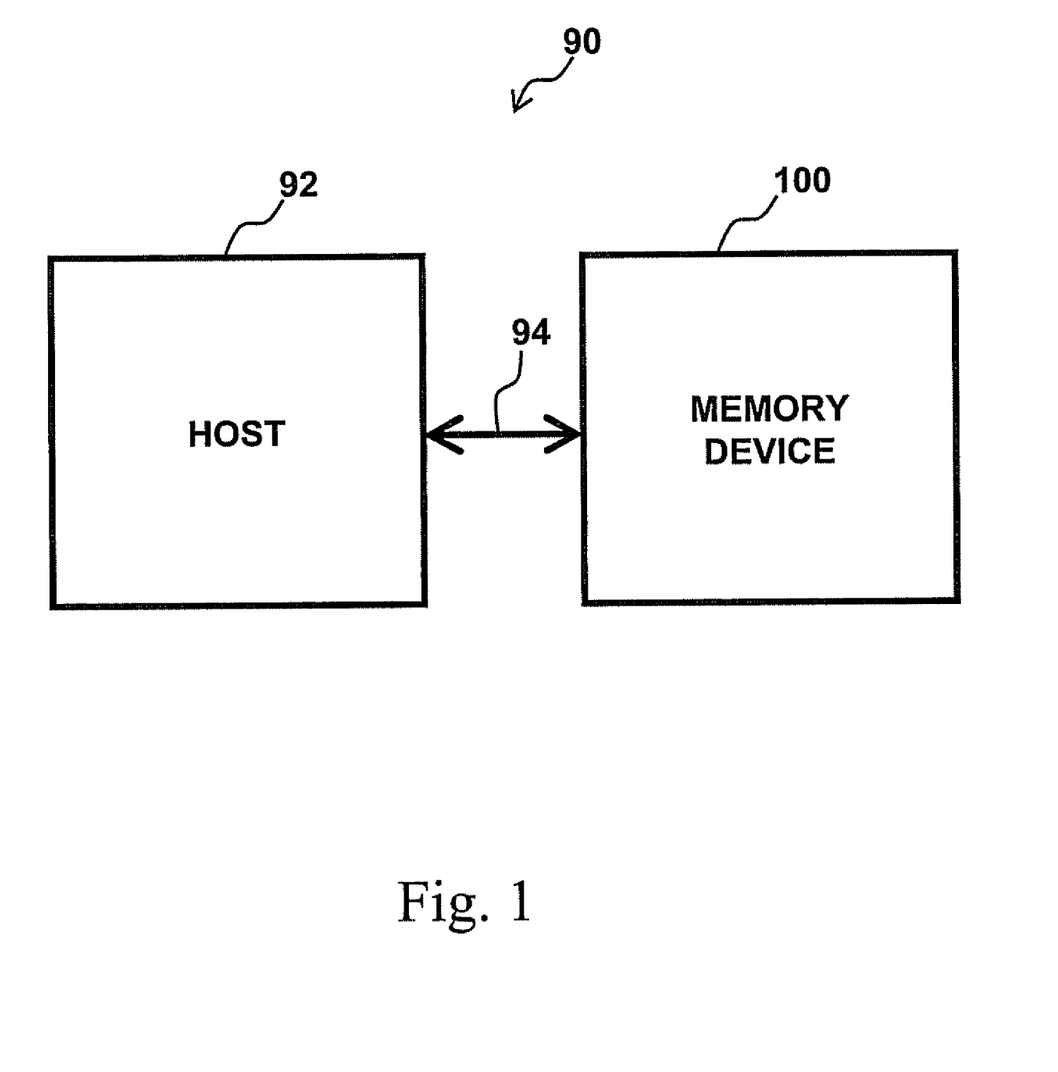
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a microprocessor, computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
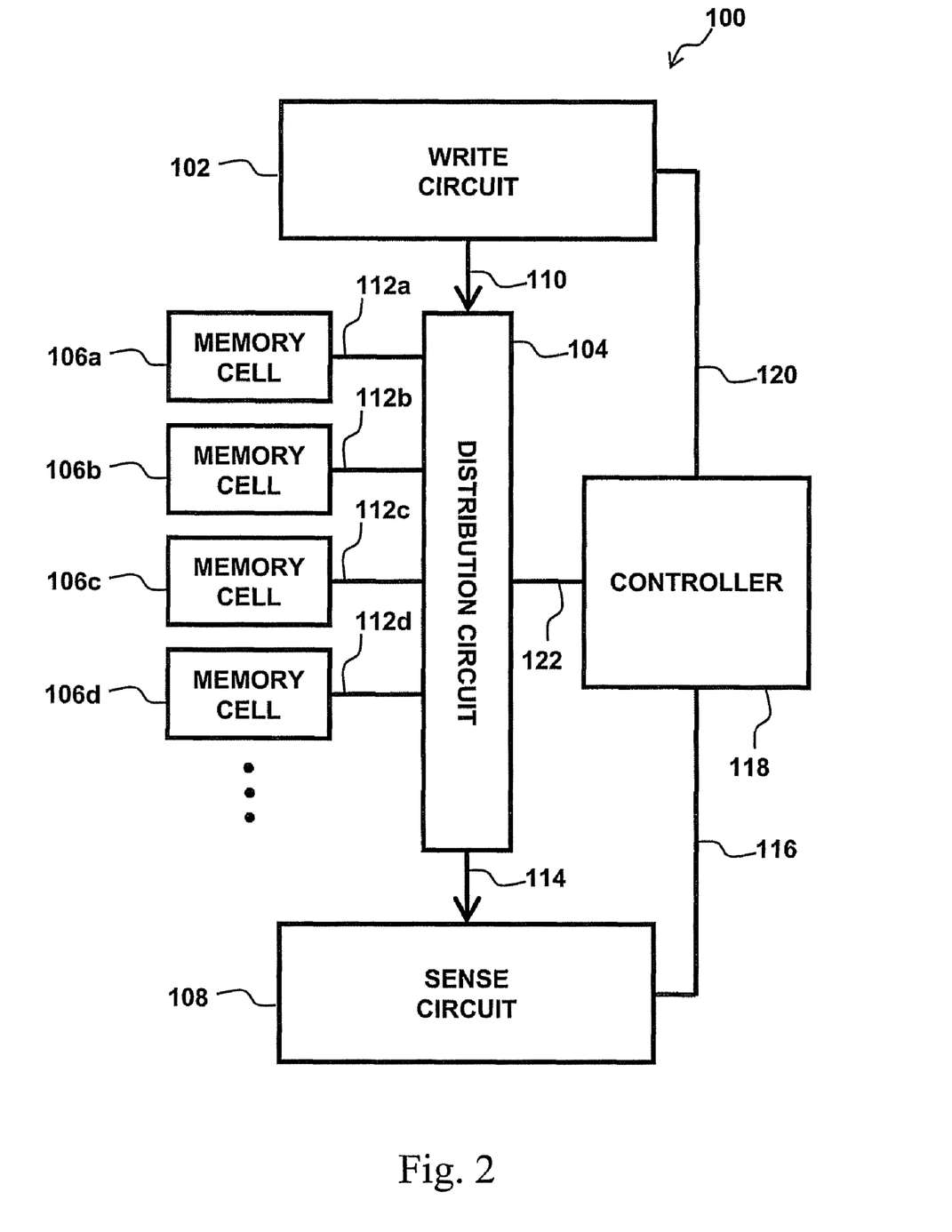
FIG. 2 is a block diagram illustrating one embodiment of a memory device.

FIG. 2 is a block diagram illustrating one embodiment of memory device 100. In one embodiment, memory device 100 is an integrated circuit or part of an integrated circuit. Memory device 100 includes a write circuit 102, a distribution circuit 104, memory cells 106a, 106b, 106c, and 106d, a controller 118, and a sense circuit 108. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material and hence the cell resistance is controlled using a suitable write strategy.

Each of the memory cells 106a-106d includes phase change material. The phase change material is deposited over a bottom electrode. The phase change material is deposited using chemical vapor deposition (CVD), atomic layer deposition (ALD), physical vapor deposition (PVD), solution based spin-on, or other suitable deposition technique.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. Distribution circuit 104 is electrically coupled to sense circuit 108 through signal path 114. Sense circuit 108 is electrically coupled to controller 118 through signal path 116. Controller 118 is electrically coupled to write circuit 102 through signal path 120 and to distribution circuit 104 through signal path 122.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a ternary system is used, wherein the three states are assigned bit values of "0", "1", and "2". In another embodiment, the two or more states include four states that are assigned multi-bit values, such as "00", "01", "10", and "11". In other embodiments, the two or more states can be any suitable number of states in the phase change material of a memory cell.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access. In one embodiment, controller 118 is embedded on the same chip as memory cells 106a-106d. In another embodiment, controller 118 is located on a separate chip from memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In another embodiment, write circuit 102 provides current pulses to distribution circuit 104 through signal path 110, and distribution circuit 104 controllably directs the current pulses to memory cells 106a-106d through signal paths 112a-112d. In one embodiment, distribution circuit 104 includes a plurality of transistors that controllably direct the voltage pulses or the current pulses to each of the memory cells 106a-106d. In another embodiment, distribution circuit 104 includes a plurality of diodes that controllably direct the voltage pulses or the current pulses to each of the memory cells 106a-106d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

In one embodiment, to read the resistance of one of the memory cells 106a-106d, sense circuit 108 provides current that flows through one of the memory cells 106a-106d and sense circuit 108 reads the voltage across that one of the memory cells 106a-106d. In another embodiment, sense circuit 108 provides voltage across one of the memory cells 106a-106d and reads the current that flows through that one of the memory cells 106a-106d. In another embodiment, write circuit 102 provides voltage across one of the memory cells 106a-106d and sense circuit 108 reads the current that flows through that one of the memory cells 106a-106d. In another embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates one or more current or voltage pulses for heating the phase change material in the target memory cell. In one embodiment, write circuit 102 generates appropriate current or voltage pulses, which are fed into distribution circuit 104 and distributed to the appropriate target memory cell 106a-106d. The amplitude and duration of the current or voltage pulses are controlled depending on whether the memory cell is being set or reset.

Generally, a "set" operation of a memory cell is heating the phase change material of the target memory cell above its crystallization temperature (but usually below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state.

During "set" operation or "reset" operation the phase change material is partially heated. That portion of the phase change material which is effectively heated and which changes from crystalline to amorphous state or vice versa is called the active portion of the phase change material or the active zone. That portion of the phase change material which is not sufficiently heated for phase transition (which is not changing from crystalline to amorphous state or vice versa) is called the inactive portion of the phase change material or the inactive zone.

Figure 3:
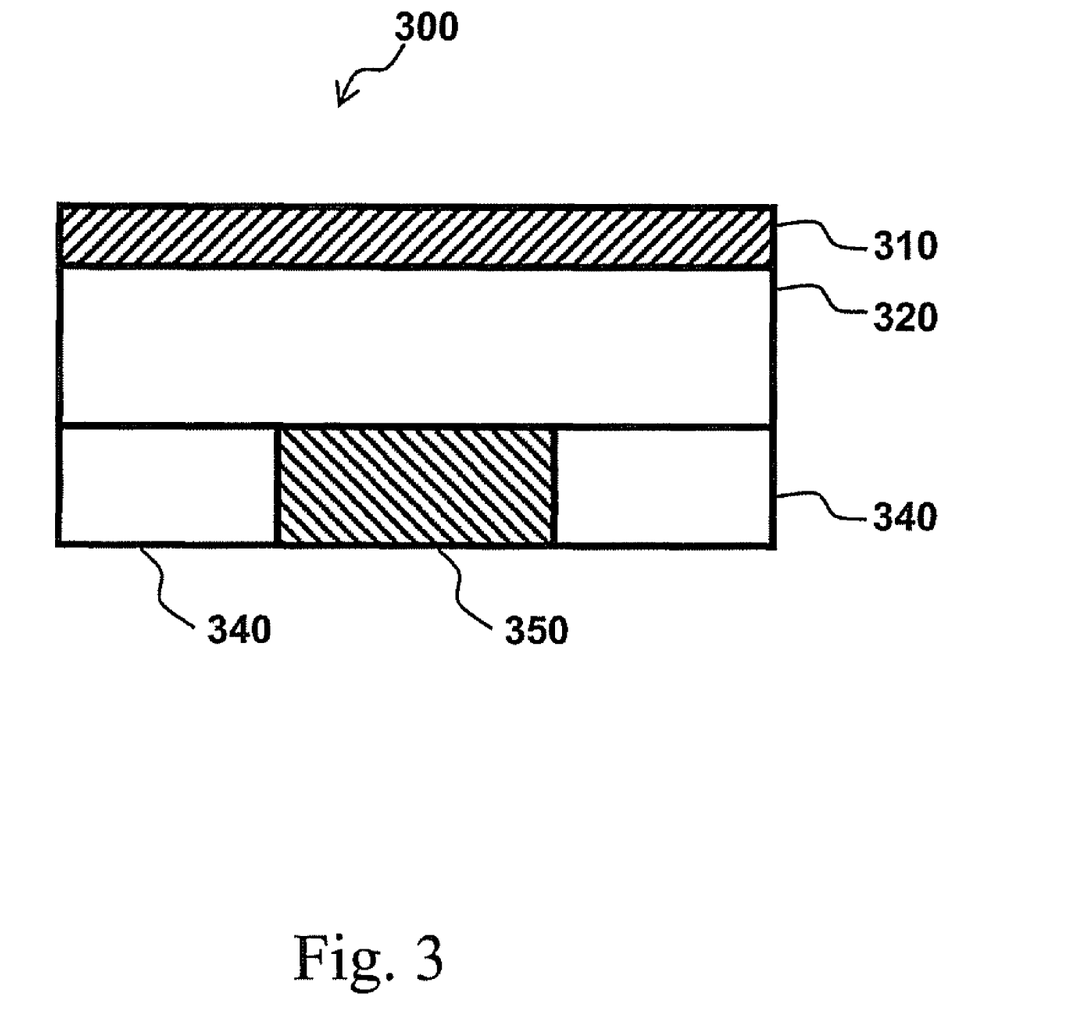
FIG. 3 illustrates a cross-sectional view of one embodiment of a phase change memory cell.

FIG. 3 illustrates a cross-sectional view of one embodiment of a phase change memory cell 300. In one embodiment, each of the phase change memory cells 106a-106d previously described and illustrated with reference to FIG. 2 is similar to phase change memory cell 300. Phase change memory cell 300 includes a first electrode 350, a phase change element 320, a second electrode 310, and dielectric material 340. Phase change element 320 includes fast-operation or high speed phase change material and is doped with dielectric material.

First electrode 350 includes TiN, TaN, W, Al, Ti, Ta, TiSiN, TaSiN, TiAlN, TaAlN, WN, C, CN, TaCN, or other suitable electrode material. In one embodiment, phase change element 320 has a greater cross-sectional width than first electrode 350, such that first electrode 350 provides a heater electrode. The top of first electrode 350 contacts the bottom of phase change element 320.

In one embodiment, phase change material of phase change element 320 includes a phase change material that may be made up of a variety of materials. Generally, chalcogenide alloys that contain one or more elements from Group VI of the periodic table are useful as such materials. In one embodiment, the phase change material is made up of a chalcogenide compound material, such as GeSbTe (GST), SbTe, GeTe, AgInSbTe, $Ge_2Sb_2Te_5$, InSbTe, (GeSn)SbTe, GaSeTe, GeSb(SeTe), $SnSb_2Te_4$, $Te_{81}Ge_{15}Sb_2S_2$, or $Sb_2Te_3$. In another embodiment, the phase change material is chalcogen free, such as GeSb, GaSb, InSb, or GeGaInSb, InSe, or InSbGe. In further embodiments, Bi replaces Sb in the aforementioned materials. In other embodiments, the phase change material is made up of any suitable material including one or more of the elements Ge, Sb, Te, Ga, As, In, Ge, Se, Ag, Bi, and S.

In US 2007/0034850 A1 chalcogenide compound materials are discussed having reduced Germanium or Tellurium content and therefore increased Antimony content. The results for these materials indicate a decreased "set" time. In one embodiment, phase change element 320 includes chalcogenide compound materials with increased Antimony content of more than 40 atomic percent doped with dielectric material. In another embodiment, phase change element 320 includes GST material with an Antimony content greater than 50 atomic percent doped with dielectric material.

The phase change material of phase change element 320 is deposited using chemical vapor deposition (CVD), atomic layer deposition (ALD), physical vapor deposition (PVD), solution based spin-on, or other suitable deposition technique.

The dielectric material for doping the phase change element 320 includes $SiO_2$, $SiO_x$, SiN, $SiN_x$, SiON, $Al_2O_3$, GaN, C (substantially insulating), or SiC. In one embodiment, the dielectric material is co-sputtered. In other embodiments, the dielectric material is doped to the phase change material by simultaneous or sequential PVD, CVD, ALD, or any other suitable technique.

In one embodiment, the phase change element 320 is doped with dielectric material in the range of 1 to 20 atomic percent. In another embodiment, the phase change element 320 is doped with dielectric material in the range of 6 to 12 atomic percent.

Phase change element 320 has a greater cross-sectional width than first electrode 350 (so called "mushroom" concept).

The top of phase change element 320 contacts the bottom of second electrode 310. In one embodiment, second electrode 310 has the same or a greater cross-sectional width than phase change element 320. Second electrode 310 includes TiN, TaN, W, Al, Ti, Ta, TiSiN, TaSiN, TiAlN, TaAlN, WN, C, CN, TaCN, or other suitable electrode material. Dielectric material 340 laterally surrounds first electrode 350. Dielectric material 340 includes $SiO_2$, $SiO_x$, SiN, SiON, $AlO_x$, fluorinated silica glass (FSG), boro-phosphorus silicate glass (BPSG), boro-silicate glass (BSG), or other suitable dielectric material.

Phase change element 320 provides a storage location for storing one or more bits of data. During operation of memory cell 300, current or voltage pulses are applied between first electrode 350 and second electrode 310 to program the memory cell.

During a "set" operation of memory cell 300, one or more set current or voltage pulses are selectively enabled by write circuit 102 and sent to first electrode 350 or second electrode 310. From first electrode 350 or second electrode 310, the set current or voltage pulses pass through phase change element 320 thereby heating the phase change material above its crystallization temperature (but usually below its melting temperature). In this way, the phase change material reaches a crystalline state or a partially crystalline and partially amorphous state during the "set" operation.

During a "reset" operation of memory cell 300, a reset current or voltage pulse is selectively enabled by write circuit 102 and sent to first electrode 350 or second electrode 310. From first electrode 350 or second electrode 310, the reset current or voltage pulse passes through phase change element 320. The reset current or voltage quickly heats the phase change material above its melting temperature. After the current or voltage pulse is turned off, the phase change material quickly quench cools into an amorphous state or a partially amorphous and partially crystalline state.

Figure 4:
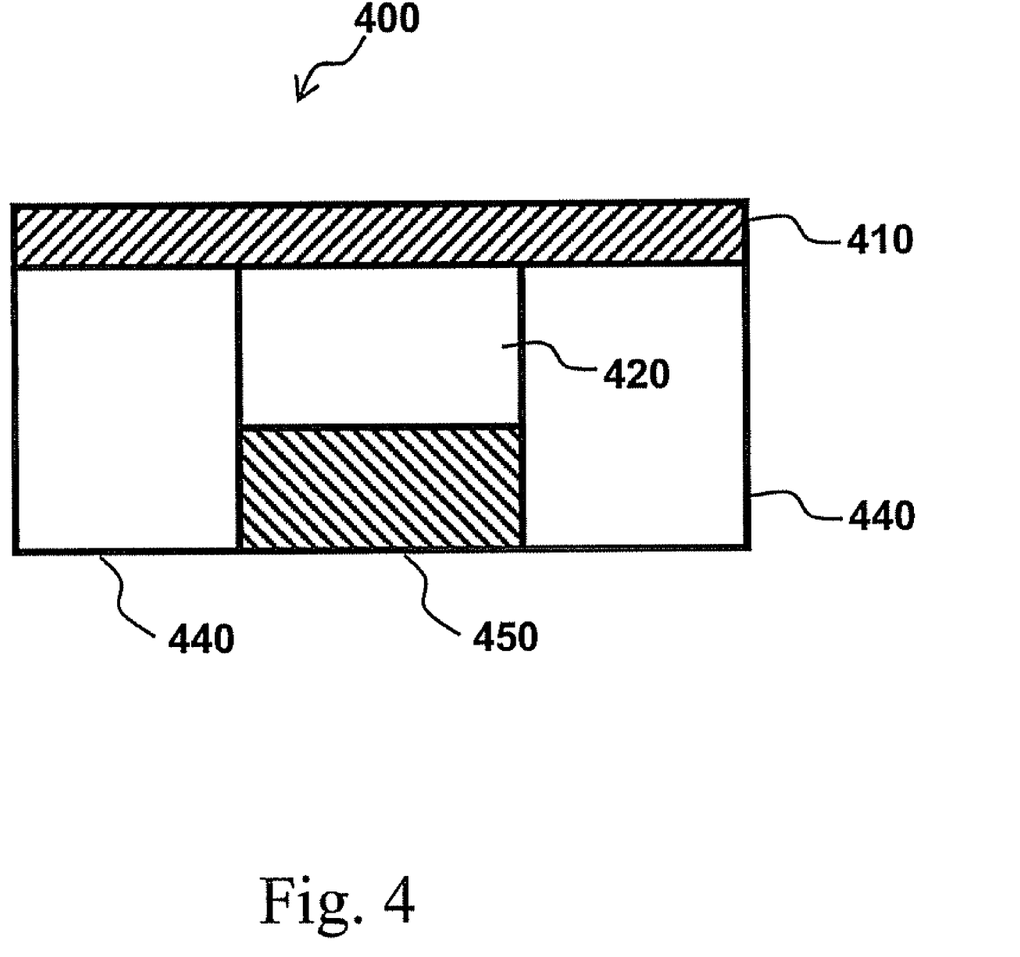
FIG. 4 illustrates a cross-sectional view of another embodiment of a phase change memory cell.

FIG. 4 illustrates a cross-sectional view of another embodiment of a phase change memory cell 400. Memory cell 400 includes first electrode 450, memory element 420, and second electrode 410. Dielectric material 440 laterally surrounds first electrode 450 and memory element 420. Memory element 420 includes fast-operation or high speed phase change material doped with dielectric material. In one embodiment, memory element 420 includes chalcogenide compound materials with increased Antimony content of more than 40 atomic percent doped with dielectric material. In another embodiment, memory element 420 includes GST material with an Antimony content greater than 50 atomic percent doped with dielectric material. In one embodiment, the phase change element 420 is doped with dielectric material in the range of 1 to 20 atomic percent. In another embodiment, the phase change element 420 is doped with dielectric material in the range of 6 to 12 atomic percent.

In contrast to FIG. 3, phase change element 420 has nearly the same cross-sectional width as first electrode 450 (so called "pillar" or "pore" concept).

Figure 5:
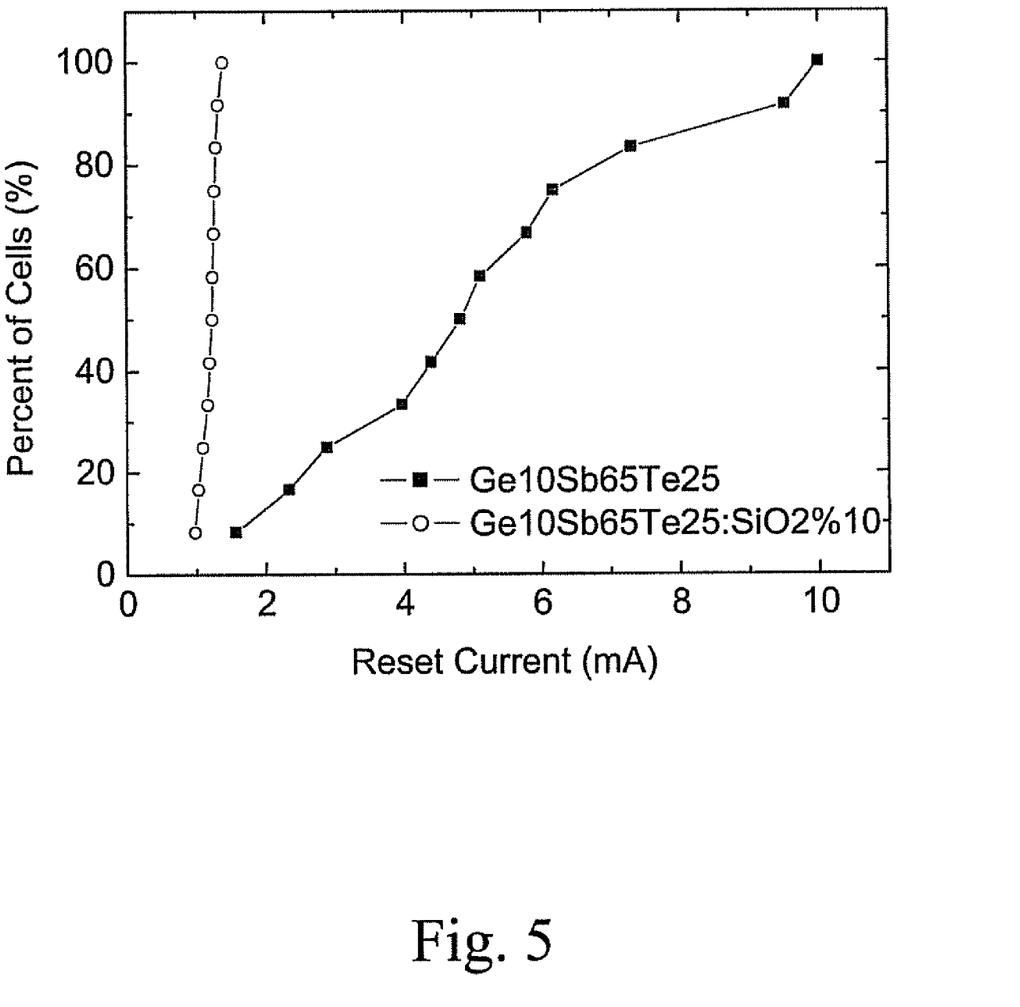
FIG. 5 illustrates the "reset" current distribution for one embodiment of phase change memory cells.

FIG. 5 illustrates the "reset" current distribution for one embodiment of a phase change memory cell. The "reset" currents for two different sets of phase change memory elements are compared. The solid symbols represent phase change memory cells including fast-operation material. The fast-operation material is $Ge_{10}Sb_{65}Te_{25}$. The open symbols represent phase change memory cells including fast-operation material doped with dielectric material. The fast-operation material is the same as for the solid symbols ($Ge_{10}Sb_{65}Te_{25}$), the doping material is $SiO_2$ in a concentration of 10 atomic percent. Doping material $SiO_2$ is co-sputtered to the phase change memory material. The lateral dimension of the phase change memory cells is 80 nm.

The solid and open symbols represent the currents for resetting every phase change memory cell to a resistance value of 15 kΩ. Due to the doping of the $Ge_{10}Sb_{65}Te_{25}$ with $SiO_2$, the median "reset" current of the memory cell shifts from 5 mA for $Ge_{10}Sb_{65}Te_{25}$ to 1.23 mA for $Ge_{10}Sb_{65}Te_{25}$ doped with 10 atomic percent of $SiO_2$.

Figure 6A:
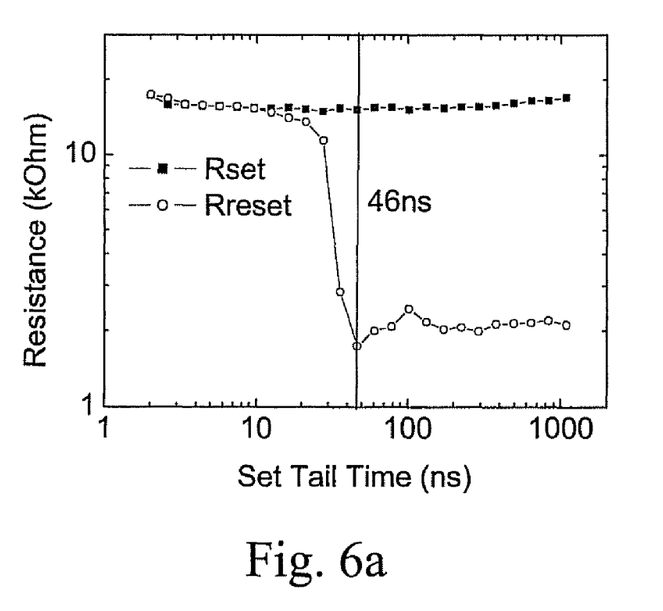
FIG. 6a illustrates the "set" and "reset" tail time variation for a fast-operation phase change memory cell.

FIG. 6a illustrates the "set" and "reset" resistance for a set tail time variation for a fast-operation phase change memory cell. The phase change memory cell is selected from FIG. 5 representing a resistance value of 15 kΩ. The fast-operation material is $Ge_{10}Sb_{65}Te_{25}$. Solid symbols represent the resistance of the phase change memory cell for "reset" tail of 2 ns. The resistance of the memory cell is nearly constant for "reset" operations. The open symbols represent the resistance of the phase change memory cells for different "set" tails. The "set" operation speed can be determined to be 46 nsec for the fast-operation phase change memory cell. The lateral dimension of the phase change memory cells is 80 nm.

Figure 6B:
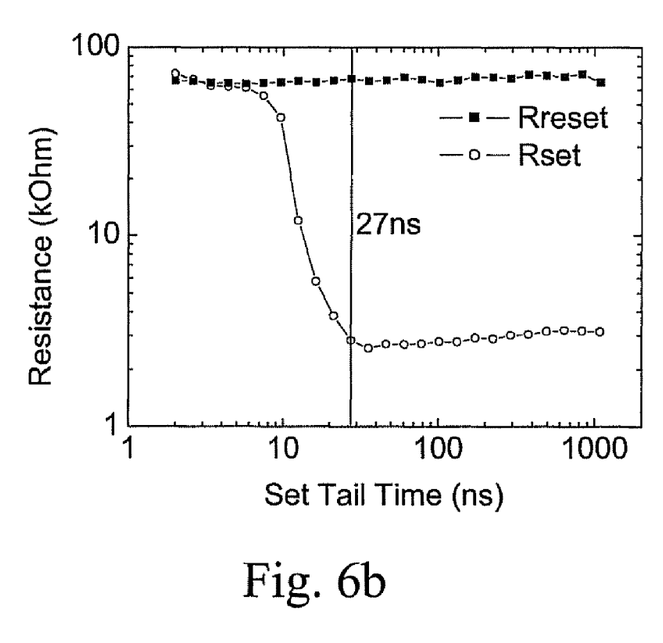
FIG. 6b illustrates the "set" and "reset" tail time variation for one embodiment of a phase change memory cell.

FIG. 6b illustrates the "set" and "reset" resistance for a set tail time variation for a fast-operation phase change memory cell doped with dielectric material. The phase change memory cell is selected from FIG. 5 representing a resistance value of 15 kΩ. The fast-operation material is the same as for in FIG. 6a ($Ge_{10}Sb_{65}Te_{25}$), the doping material is $SiO_2$ in a concentration of 10 atomic percent. Solid symbols represent the resistance of the phase change memory cell for "reset" tail of 2 ns. The resistance of the memory cell is nearly constant for "reset" operations. The open symbols represent the resistance of the phase change memory cells for different "set" tails. The "set" operation speed can be determined to be 27 nsec for the fast-operation phase change memory cell. The lateral dimension of the phase change memory cells is 80 nm.

Comparing the "set" operation speeds of the $Ge_{10}Sb_{65}Te_{25}$ (46 nsec) and the $SiO_2$ doped $Ge_{10}Sb_{65}Te_{25}$ (27 nsec) illustrate the reduced "set" speed of the doped fast-operation phase change material.

Figure 7:
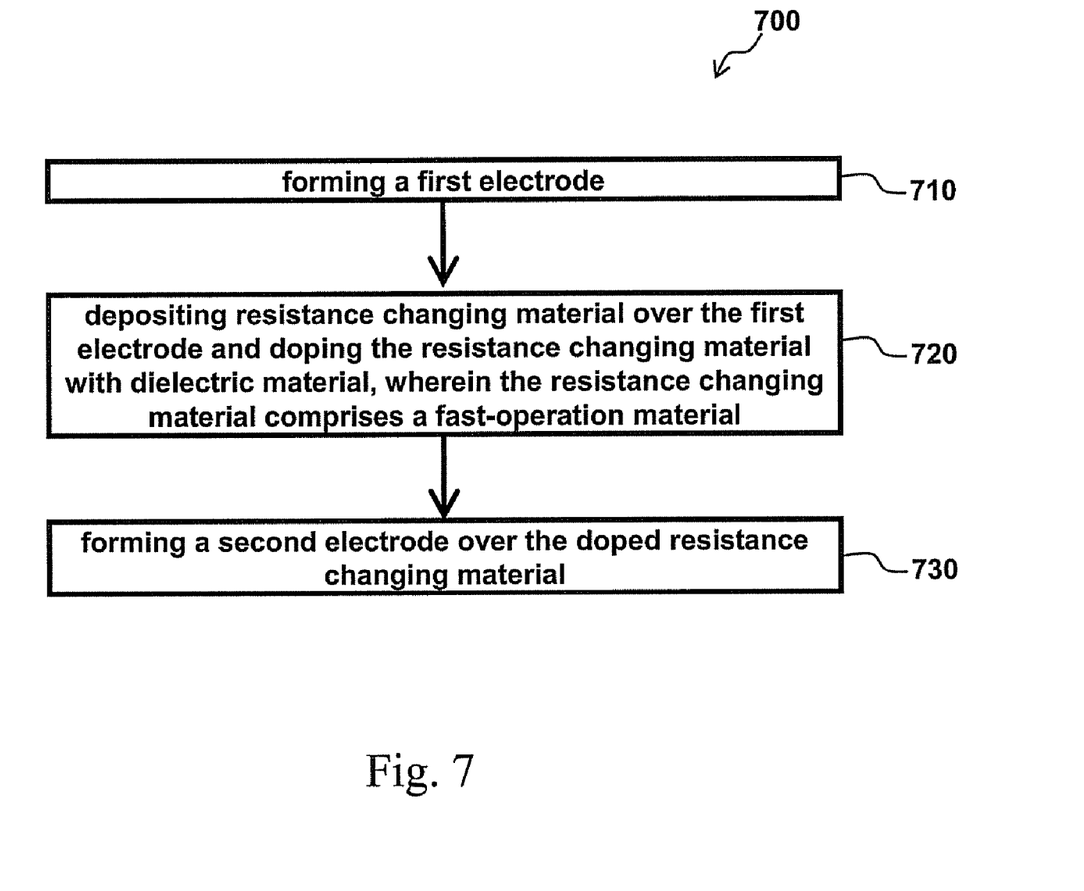
FIG. 7 illustrates a method for fabricating an integrated circuit.

FIG. 7 illustrates one embodiment of a method 700 for fabricating an integrated circuit. At 710, a first electrode is formed. At 720, resistance changing material is deposited over the first electrode and doped with dielectric material, wherein the resistance changing material includes a fast-operation material. At 730, a second electrode is formed over the doped resistance changing material.

Embodiments provide a phase change memory cell including a phase change element having fast-operation or high speed phase change material doped with dielectric material. Embodiments provide memory elements including chalcogenide compound materials with increased Antimony content of more than 40 atomic percent doped with dielectric material. Other embodiments provide memory elements having GST material with an Antimony content greater than 50 atomic percent doped with dielectric material. Embodiments provide phase change elements doped with dielectric material in the range of 1 to 20 atomic percent. Other embodiments provide phase change elements doped with dielectric material in the range of 6 to 12 atomic percent.

While the specific embodiments described herein substantially focused on fabricating phase change memory cells, the embodiments can be applied to any suitable type of resistive or resistivity changing memory cells.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a first electrode;
a second electrode; and
a memory element coupled to the first electrode and to the second electrode, the memory element comprises fast-operation resistance changing material doped with dielectric material,
wherein the fast-operation resistance changing material comprises GST, and wherein the Antimony content of the fast-operation GST is greater than 40 atomic percent.

2. The integrated circuit of claim 1, wherein the Antimony content of the fast-operation GST is greater than 50 atomic percent.

3. The integrated circuit of claim 1, wherein the doping material comprises $SiO_2$, $SiO_x$, $SiN$, $SiN_x$, $SiON$, $Al_2O_3$, GaN, C, or SiC.

4. The integrated circuit of claim 3, wherein the doping of the memory element is in the range of 1 to 20 atomic percent.

5. The integrated circuit of claim 3, wherein the doping of the memory element is in the range of 6 to 12 atomic percent.

6. A system comprising:
a host; and
a memory device communicatively coupled to the host, the memory device comprising:
a first electrode;
a second electrode; and
a memory element coupled to the first electrode and to the second electrode, the memory element comprises fast-operation resistance changing material doped with dielectric material, wherein the fast-operation resistance changing material comprises GST, and wherein the Antimony content of the fast-operation GST is greater than 50 atomic percent.

7. The system of claim 6, wherein the doping of the memory element is in the range of 6 to 12 atomic percent.

8. An integrated circuit comprising:

a first electrode;

a second electrode; and a memory element coupled to the first electrode and to the second electrode, the memory element comprises GST doped with $SiO_2$, wherein the Antimony content of the GST is greater than 40 atomic percent, and wherein the $SiO_2$ is in the range of 1 to 20 atomic percent.

9. The integrated circuit of claim 8, wherein the Antimony content of the GST is greater than 50 atomic percent, and wherein the $SiO_2$ is in the range of 6 to 12 atomic percent.

* * * * *